United States Patent
Classen

(10) Patent No.: US 10,031,038 B2
(45) Date of Patent: Jul. 24, 2018

(54) MICROMECHANICAL PRESSURE SENSOR DEVICE INCLUDING, FORMED SIDE-BY-SIDE IN A MICROMECHANICAL FUNCTIONAL LAYER, FIRST AND SECOND MICROMECHANICAL FUNCTIONAL REGIONS THAT CORRESPOND TO A PRESSURE SENSOR AND ANOTHER SENSOR, AND CORRESPONDING MANUFACTURING METHOD

(71) Applicant: Robert Bosch GmbH, Stuttgart (DE)

(72) Inventor: Johannes Classen, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/110,726

(22) PCT Filed: Nov. 17, 2014

(86) PCT No.: PCT/EP2014/074748
§ 371 (c)(1),
(2) Date: Jul. 8, 2016

(87) PCT Pub. No.: WO2015/106854
PCT Pub. Date: Jul. 23, 2015

(65) Prior Publication Data
US 2016/0341616 A1 Nov. 24, 2016

(30) Foreign Application Priority Data
Jan. 14, 2014 (DE) .................. 10 2014 200 507

(51) Int. Cl.
*B81B 7/00* (2006.01)
*B81C 1/00* (2006.01)
(Continued)

(52) U.S. Cl.
CPC .......... *G01L 9/0042* (2013.01); *B81B 7/0061* (2013.01); *B81B 7/02* (2013.01);
(Continued)

(58) Field of Classification Search
CPC ... G01L 9/0042; G01L 9/0073; B81B 7/0061; B81B 7/02; B81B 2201/025; B81B 2201/0264; B81C 1/00246; H01L 2224/11
(Continued)

(56) References Cited

U.S. PATENT DOCUMENTS 7,250,353 B2   7/2007  Nasiri
7,442,570 B2   10/2008 Nasiri
(Continued)

FOREIGN PATENT DOCUMENTS

DE   102006039422   3/2007
DE   102006011545   9/2007
(Continued)

OTHER PUBLICATIONS

International Search Report dated Mar. 27, 2015, of the corresponding International Application PCT/EP2014/074748 filed Nov. 17, 2014, 2 pages.

*Primary Examiner* — Marcos D Pizarro
*Assistant Examiner* — Nelson Garces
(74) *Attorney, Agent, or Firm* — Norton Rose Fulbright US LLP; Gerard Messina

(57) ABSTRACT

A micromechanical pressure sensor device and a corresponding manufacturing method. The micromechanical pressure sensor device includes an ASIC wafer, a rewiring system, formed on the front side, which includes a plurality of strip conductor levels and insulating layers situated in between, a structured insulating layer formed above an uppermost strip conductor level, a micromechanical functional layer formed on the insulating layer and which
(Continued)

includes a diaphragm area, which may be acted on by pressure, above a recess in the insulating layer as a first pressure detection electrode, and a second pressure detection electrode on the uppermost strip conductor level, formed in the recess at a distance from the diaphragm area and is electrically insulated from the diaphragm area. The diaphragm area is electrically connected to the uppermost strip conductor level by one or multiple first contact plugs which are led through the diaphragm area and through the insulating layer.

13 Claims, 10 Drawing Sheets

(51) Int. Cl.
    *H01L 21/44*     (2006.01)
    *H01L 21/48*     (2006.01)
    *H01L 21/50*     (2006.01)
    *B81B 3/00*     (2006.01)
    *H01L 23/48*     (2006.01)
    *G01L 9/00*     (2006.01)
    *B81B 7/02*     (2006.01)

(52) U.S. Cl.
    CPC ........ *B81C 1/00246* (2013.01); *G01L 9/0073* (2013.01); *B81B 2201/025* (2013.01); *B81B 2201/0264* (2013.01); *H01L 2224/11* (2013.01)

(58) Field of Classification Search
    USPC .................................................. 257/412–419
    See application file for complete search history.

(56) References Cited

U.S. PATENT DOCUMENTS

| | | | |
|---|---|---|---|
| 9,073,746 B2* | 7/2015 | Liu | B81C 1/00158 |
| 2012/0049299 A1 | 3/2012 | Chou | |
| 2012/0248615 A1* | 10/2012 | Chien | B81C 1/0023 |
| | | | 257/770 |
| 2013/0001710 A1 | 1/2013 | Daneman | |
| 2013/0334626 A1 | 12/2013 | Weber | |
| 2015/0137276 A1* | 5/2015 | Cheng | B81C 1/00293 |
| | | | 257/415 |
| 2015/0175406 A1* | 6/2015 | Lin | B81B 7/007 |
| | | | 257/415 |
| 2015/0175407 A1* | 6/2015 | Cheng | B81C 1/00246 |
| | | | 257/415 |

FOREIGN PATENT DOCUMENTS

| | | |
|---|---|---|
| DE | 102010006132 | 8/2011 |
| WO | WO2012040211 | 3/2012 |

* cited by examiner

MICROMECHANICAL PRESSURE SENSOR DEVICE INCLUDING, FORMED SIDE-BY-SIDE IN A MICROMECHANICAL FUNCTIONAL LAYER, FIRST AND SECOND MICROMECHANICAL FUNCTIONAL REGIONS THAT CORRESPOND TO A PRESSURE SENSOR AND ANOTHER SENSOR, AND CORRESPONDING MANUFACTURING METHOD

FIELD

The present invention relates to a micromechanical pressure sensor device and a corresponding manufacturing method.

BACKGROUND INFORMATION

Although any micromechanical components are applicable, the present invention and its underlying object to be achieved are explained with reference to components which include inertial sensors based on silicon.

Micromechanical sensor devices for measuring acceleration, rotation rate, magnetic field, and pressure, for example, are generally known, and are mass-produced for various applications in the automotive and consumer sectors. In particular the miniaturization of components, functional integration, and effective cost reduction are trends in consumer electronics.

Nowadays, acceleration sensors and rotation rate sensors, as well as acceleration sensors and magnetic field sensors, are already manufactured as combination sensors (6d), and in addition there are first 9d modules, in which in each case 3-axis acceleration sensors, rotation rate sensors, and magnetic field sensors are combined into a single sensor device.

In contrast, pressure sensors nowadays are developed and manufactured separately from the above-mentioned 6d and 9d modules. An important reason for this is the necessary media access which a pressure sensor requires, as opposed to inertial sensors and magnetic sensors, which greatly increases the effort and the costs for packaging the pressure sensor. Other reasons for the separation of pressure sensors are the different MEMS manufacturing processes and the different evaluation processes. For example, pressure sensors often make use of piezoresistive resistors for the evaluation, whereas inertial sensors are preferably evaluated capacitively.

However, it is foreseeable that sensor devices which are able to measure the pressure in addition to inertial variables may represent an interesting expansion of the options for functional integration, in particular in the area of consumer electronics. Such integrated 7d modules, or, for integration of a 3-axis magnetic sensor, 10d modules, could be used for navigation applications (indoor navigation), for example. The functional integration is promising for achieving cost reductions as well as reduced space requirements on the application circuit board.

Methods of so-called vertical integration, hybrid integration, or 3D integration are described, for example, in U.S. Pat. Nos. 7,250,353 B2 and 7,442,570 B2, in which at least one MEMS wafer and one evaluation ASIC wafer are mechanically and electrically connected to one another via wafer bonding processes. These vertical integration methods in combination with silicon vias and flip chip technologies are particularly attractive, for which reason the external contacting may take place as a bare die module or a chip scale package, and thus without plastic outer packaging, as described in U.S. Patent Application Publication Nos. 2012/0049299 A1 and 2012/0235251 A1, for example.

U.S. Patent Application Publication No. 2013/0001710 A1 describes a method and a system for forming a MEMS sensor device, in which a handling wafer is bonded to a MEMS wafer via a dielectric layer. After structuring the MEMS wafer to form the micromechanical sensor device, a CMOS wafer is bonded to the MEMS wafer, which includes the sensor device. At the end of the process, the handling wafer may be further processed by etching or back-grinding, if necessary.

SUMMARY

The present invention relates to a micromechanical pressure sensor device and a corresponding manufacturing method.

Preferred refinements are described below.

In accordance with the present invention, a wafer, which forms the starting point for a micromechanical functional layer, is connected to an ASIC wafer, preferably a CMOS wafer, in an electrically insulated manner via an insulating layer, an electrical connection to the uppermost strip conductor level of the ASIC wafer subsequently being established by one or multiple electrically conductive contact plugs. After the wafer is thinned to form the micromechanical functional layer, a diaphragm area is formed in the latter as a first pressure detection electrode, a second pressure detection electrode being formed under the diaphragm area in the uppermost strip conductor level. The micromechanical pressure sensor device formed in this way may be used either capped or uncapped.

It is advantageously possible to integrate one or multiple further micromechanical sensor devices, in addition to the micromechanical pressure sensor device, into the micromechanical functional layer. For example, it is possible to provide a micromechanical inertial sensor device in addition to the micromechanical pressure sensor device in the micromechanical functional layer. It is necessary only to provide a pressure access for the micromechanical pressure sensor device in the capping.

According to one preferred refinement, a first contact plug is provided which is formed as a circumferential ring. This contributes toward improving the hermeticity of the diaphragm area.

According to another preferred refinement, a cap wafer which includes a pressure access to the diaphragm area is bonded to the micromechanical functional layer. Protection may thus be achieved without influencing the functionality.

According to another preferred refinement, a cap wafer which includes a pressure access to the diaphragm area is bonded to the uppermost strip conductor level. Protection may thus be achieved while simplifying the bonding process.

According to another preferred refinement, the diaphragm area includes a thinned area of the micromechanical functional layer. The sensitivity in fairly thick functional layers may thus be increased.

According to another preferred refinement, bonding balls are formed above the micromechanical functional layer outside the diaphragm area, and are electrically connected by one or multiple second contact plugs to the uppermost strip conductor level, which are led through the micromechanical functional layer and through the insulating layer. A simple front side mounting option is thus achieved.

According to another preferred refinement, bonding balls which are electrically connected to the uppermost strip conductor level by vias are formed above the insulating layer in an area in which the micromechanical functional layer is removed. A simple front side mounting option with a reduced installation height may thus be achieved.

BRIEF DESCRIPTION OF THE DRAWINGS

Further features and advantages of the present invention are explained below based on specific embodiments, with reference to the figures.

DETAILED DESCRIPTION OF EXAMPLE EMBODIMENTS

Figure 1A:
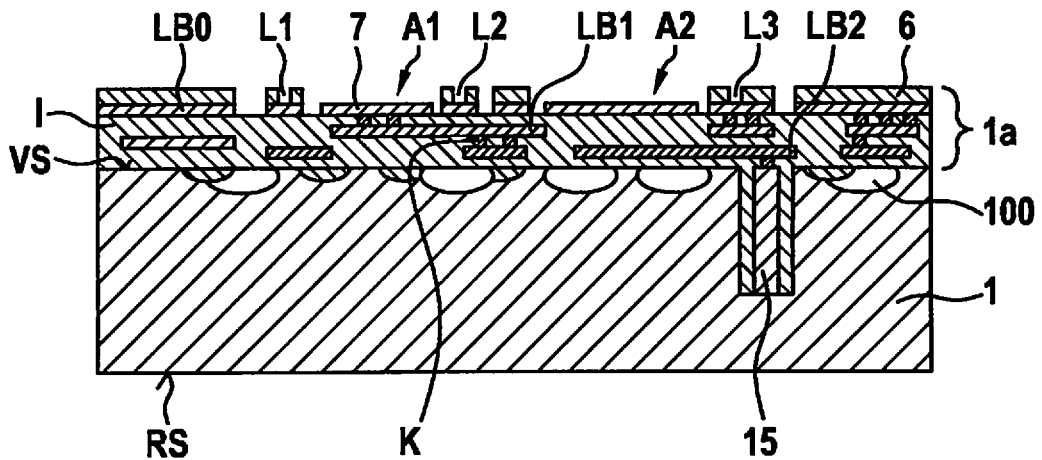
FIGS. 1a) through 1h) show schematic cross-sectional views for explaining a micromechanical pressure sensor device and a corresponding manufacturing method according to a first specific embodiment of the present invention.

Identical or functionally equivalent elements are denoted by the same reference numerals in the figures.

FIGS. 1a) through 1h) show schematic cross-sectional views for explaining a micromechanical pressure sensor device and a corresponding manufacturing method according to a first specific embodiment of the present invention.

In FIG. 1a), reference numeral 1 denotes a CMOS wafer which includes a plurality of CMOS circuits 100 which include, for example, an evaluation circuit for the micromechanical pressure sensor device to be formed.

The CMOS wafer has a front side VS and a rear side RS. On front side VS of CMOS wafer 1, a rewiring system 1a is formed which includes a plurality of strip conductor levels LB0, LB1, LB2 and insulating layers I situated in between. To simplify the illustration, insulating layers I in which strip conductor levels LB0, LB1, LB2 are embedded are not separately illustrated. The strip conductor sections of strip conductor levels LB0, LB1, LB2 are electrically connected to one another by electrically conductive vias K.

A structured insulating layer 6, preferably an oxide layer or a stack made up of oxide layers and/or nitride layers, is provided above an uppermost strip conductor level LB0.

According to FIG. 1a), recesses A1 and A2 in which uppermost strip conductor level LB0 is exposed are formed in insulating layer 6. Likewise, contact holes L1, L2, L3 are provided in which contact plugs are to be subsequently formed. However, it is also possible to not form the latter contact holes L1, L2, L3 until a subsequent process stage.

Starting from front side VS, a via 15 which is electrically connected to a bottommost strip conductor level LB2 extends into the interior of CMOS wafer 1; the via may be subsequently exposed by back-grinding from rear side RS.

Exposed areas A1 and A2 correspond to micromechanical sensor devices to be formed; specifically, area A1 corresponds to a micromechanical pressure sensor device and area A2 corresponds to a movable micromechanical inertial sensor device. The section of uppermost strip conductor level LB0 denoted by reference numeral 7 in section A1 corresponds to a second pressure detection electrode of the micromechanical pressure sensor device which is to be formed above this section A1. It is pointed out that due to the structuring of insulating layer 6, sacrificial layer etching in the areas of insulating layer 6 already removed may be dispensed with.

Figure 1B:
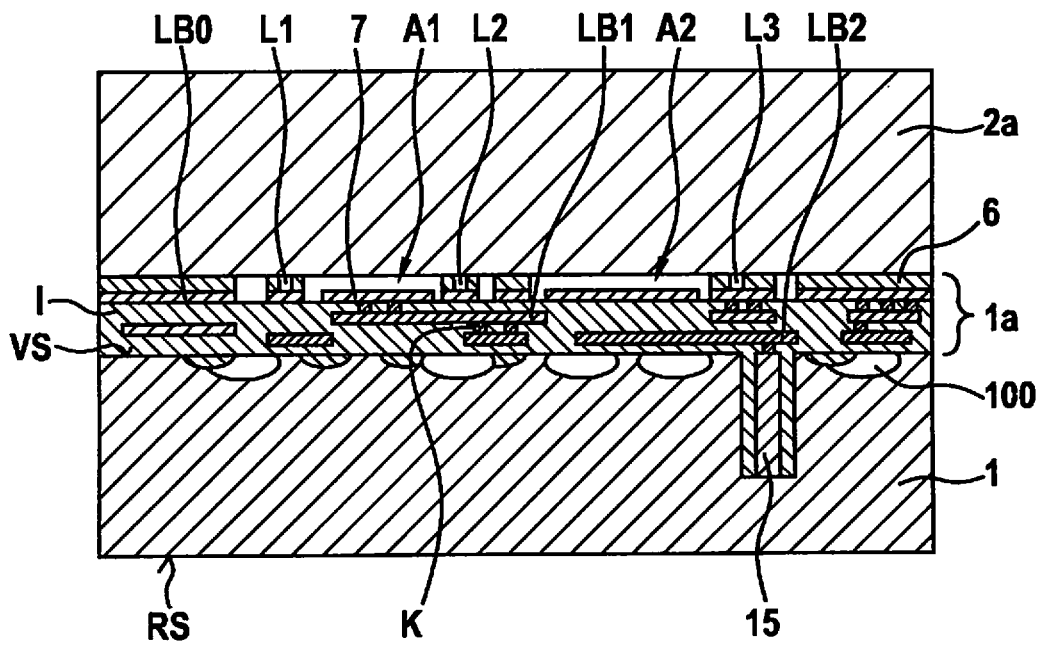

In addition, with reference to FIG. 1b), a silicon wafer 2a as the starting point for a micromechanical functional layer 2 to be formed therefrom (compare FIG. 1c)) is bonded to insulating layer 6 on the structure from FIG. 1a), preferably using a plasma-activated direct bonding process, since this process takes place at a relatively low temperature below 400° C., which has the advantage that the CMOS circuits formed in CMOS wafer 1 are not damaged by the bonding.

Figure 1C:
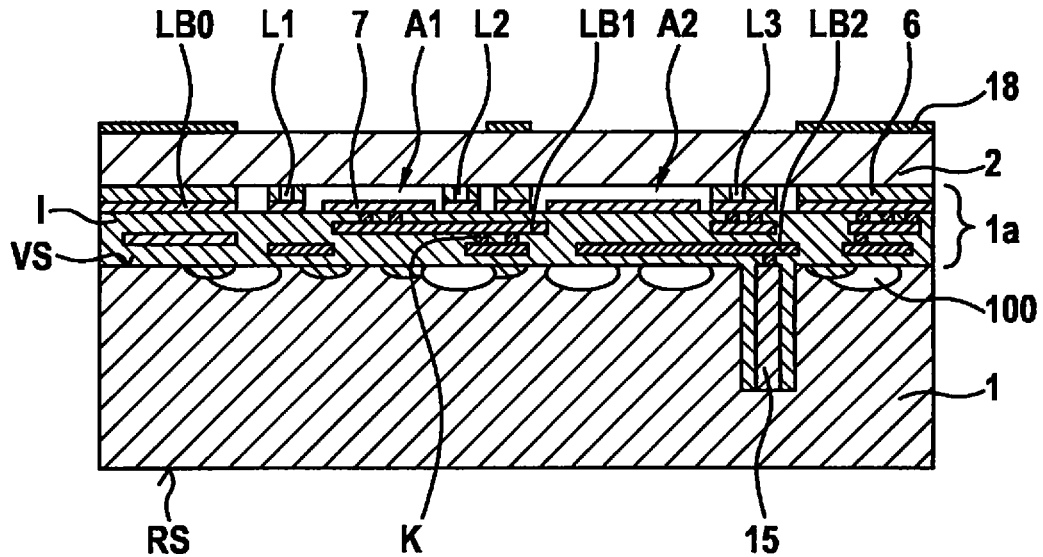

MEMS wafer 2a is subsequently thinned back to a desired thickness of a micromechanical functional layer 2 made of silicon, for example, and is covered with a first bonding layer 18 made of aluminum, for example, which is subsequently appropriately structured to form bonding areas, as shown in FIG. 1c).

Figure 1D:
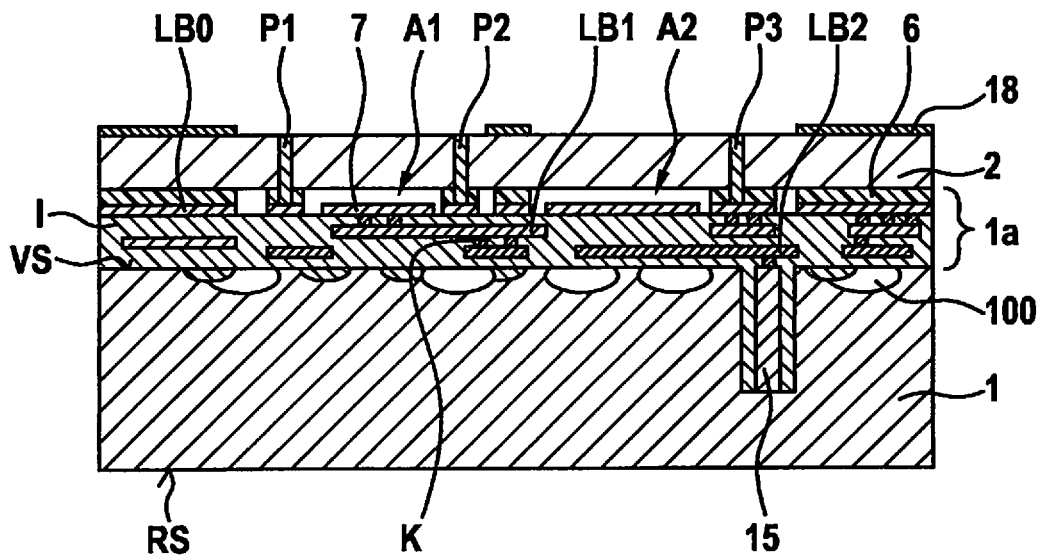

In the next process step illustrated in FIG. 1d), trench etching through micromechanical functional layer 2 and subsequent deposition and structuring of a tungsten layer take place (optionally on a previously deposited and structured thin titanium/titanium nitride adhesive layer). Contact plugs P1, P2, P3 may thus be formed, which are led through insulating layer 6 to first strip conductor level LB0, and which electrically connect the latter to micromechanical functional layer 2. Contact plugs P1, P2, P3 are either completely or partially backfilled.

Figure 1E:
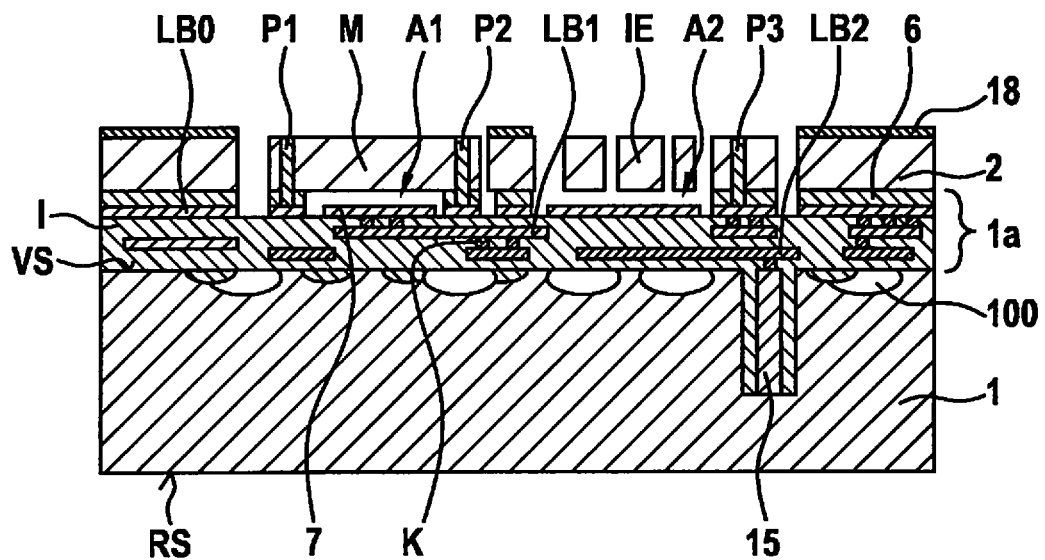

In addition, with reference to FIG. 1e), a trench etching step takes place once again, in which trenches are formed in the micromechanical functional layer which are used on the one hand as electrical insulation trenches and on the other hand for structuring the micromechanical sensor devices. In particular, a diaphragm area M which may be acted on by pressure is formed above recess A1; the diaphragm area is connected to uppermost strip conductor level LB0 via contact plugs P1, P2 and separated from the remainder of micromechanical functional layer 2 by appropriate trenches.

Structuring is carried out above area A2 by the trench etching step in order to create a movable MEMS element, in the present case, a micromechanical inertial sensor device IE. Inertial sensor device IE is electrically connected to uppermost strip conductor level LB0 via contact plug P3.

As already mentioned above, the movable structures of inertial sensor device IE are also at the same time exposed by the trench etching step, since an insulating layer 6 is no longer present therebelow, but, rather, only recess A2, which exposes uppermost strip conductor level LB0, is present.

Diaphragm area M formed in this way forms a first pressure detection electrode of the micromechanical pressure sensor device; as mentioned above, the second pressure detection electrode is formed by strip conductor section 7 of uppermost strip conductor level LB0.

Figure 9:
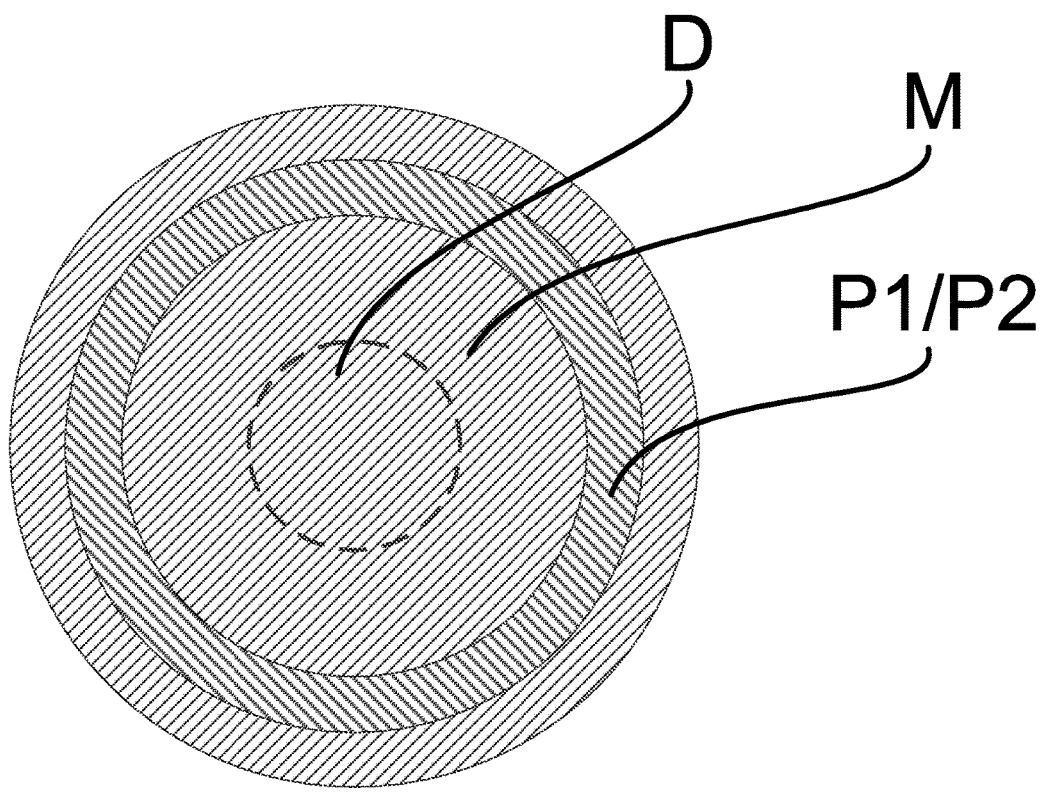
FIG. 9 shows, in cross-sectional plan view, a contact plug designed as a circumferential ring, according to an example embodiment of the present invention.

Optionally, contact plugs P1, P2 for the electrical contacting may also be designed as a circumferential ring, e.g., as shown in FIG. 9, since the hermeticity of diaphragm area M may be improved in this way.

Figure 1F:
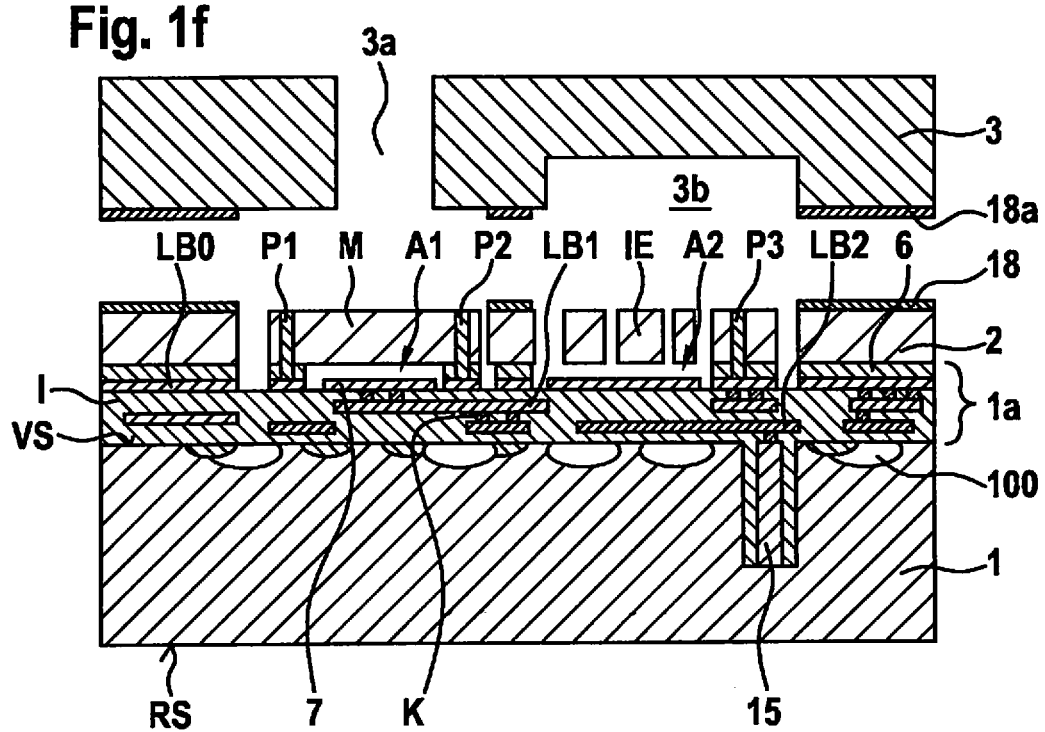

As illustrated in FIG. 1f), a cap wafer 3 is subsequently provided, which in this first specific embodiment already includes a continuous pressure access 3a as media access for the micromechanical pressure sensor device.

Cap wafer 3 also has a flat cavity 3b above inertial sensor device IE. A second bonding layer 18a, for example a germanium layer, is situated on cap wafer 3 at the provided bonding areas.

Figure 1G:
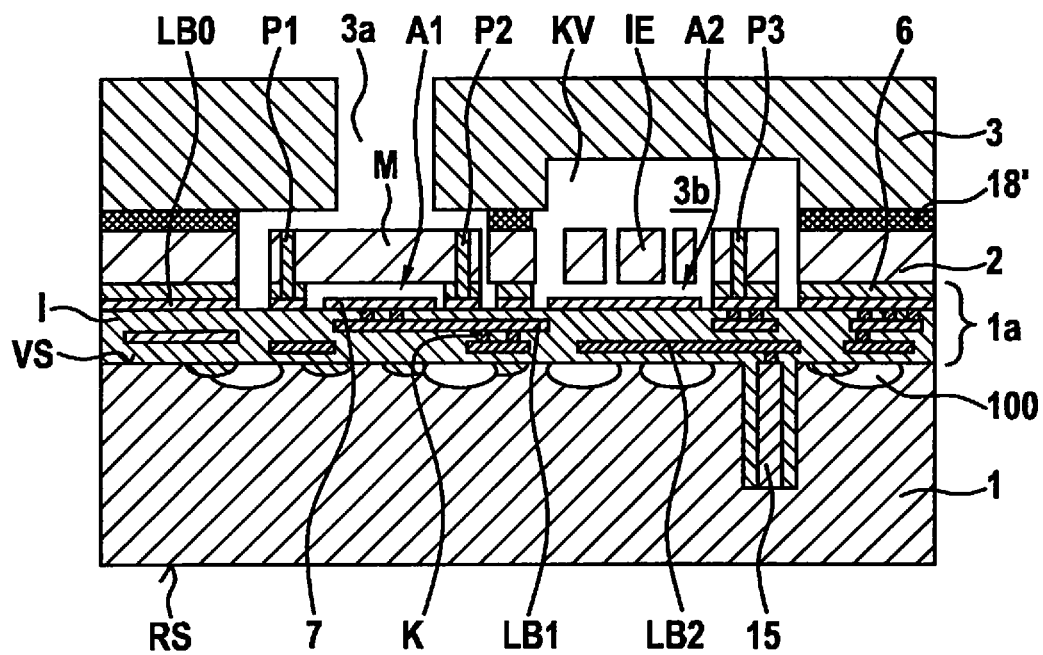

In a further process step shown in FIG. 1g), cap wafer 3 is bonded to micromechanical functional layer 2 at the provided bonding areas by way of first and second bonding layers 18, 18a, in the present example, by eutectic aluminum-germanium bonding, eutectic bond connection 18' being established between cap wafer 3 and micromechanical functional layer 2.

Due to the bonding, inertial sensor device IE is hermetically capped; the resulting cavity is denoted by reference sign K.

In contrast, the media access to the pressure sensor device is maintained by pressure access 3a, which leads through cap wafer 3.

Figure 1H:
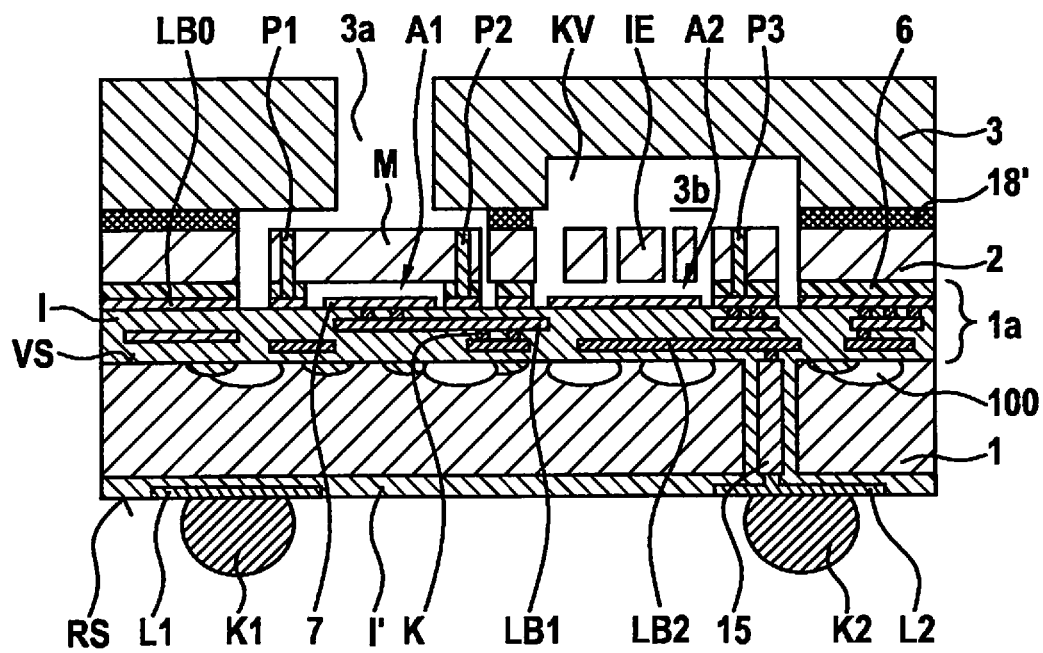

In a subsequent process step shown in FIG. 1h), back-grinding of CMOS wafer 1 takes place from rear side RS in order to expose via 15 at rear side RS.

After an additional insulating layer I' is deposited on rear side RS, strip conductor sections L1, L2 are formed on or in the insulating layer, on which bonding balls K1, K2, for example solder balls, are formed for soldering the entire combined sensor device to an appropriate substrate.

It is pointed out that, as an alternative to the previously provided opening in pressure access 3a in cap wafer 3, subsequent grinding down of another previously formed cavity in cap wafer 3 or an etching step or a laser drilling process is possible for creating the pressure access, as explained below in particular in conjunction with further specific embodiments.

Figure 2A:
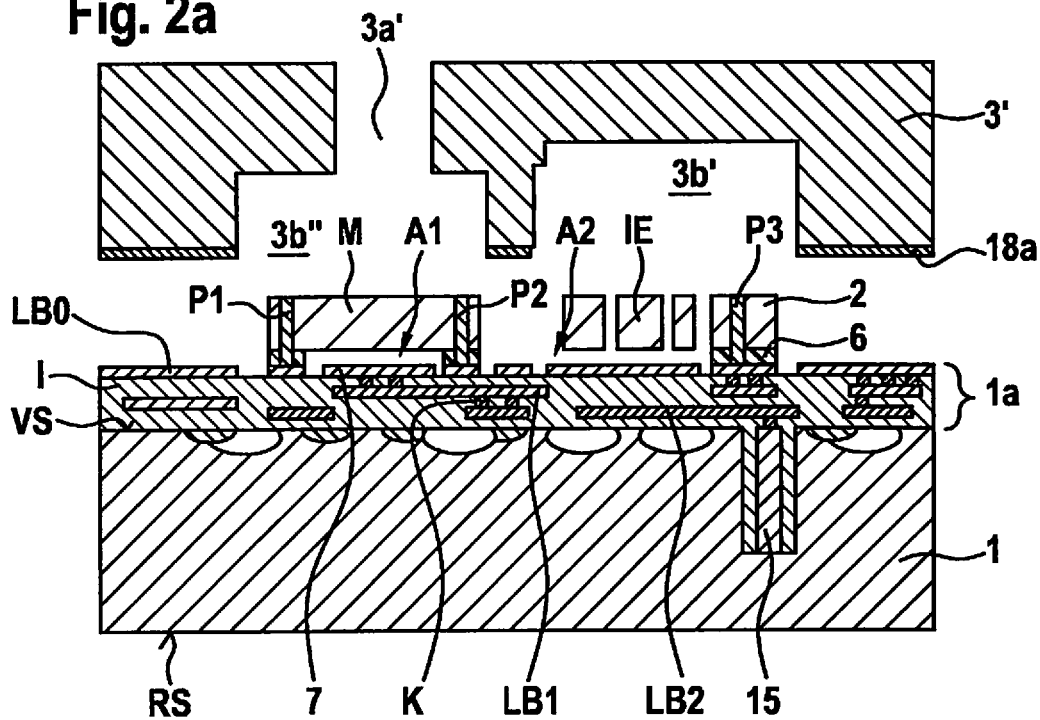
FIGS. 2a) and 2b) show schematic cross-sectional views for explaining a micromechanical pressure sensor device and a corresponding manufacturing method according to a second specific embodiment of the present invention.

FIGS. 2a), 2b) show schematic cross-sectional views for explaining a micromechanical pressure sensor device and a corresponding manufacturing method according to a second specific embodiment of the present invention.

In the second specific embodiment, the cap wafer is denoted by reference numeral 3', the continuous pressure access formed therein is denoted by reference numeral 3a', and the cavity previously formed therein is denoted by reference numeral 3b'.

The process state according to FIG. 2a) essentially corresponds to the process state according to FIG. 1f). However, in this specific embodiment, micromechanical functional layer 2 and insulating layer 6 therebelow are removed in the bonding areas. Uppermost strip conductor level LB0 is thus exposed for bonding in the bonding areas, and in these areas exposes an aluminum metal layer as a bonding surface.

First bonding layer 18a made of germanium, already mentioned in conjunction with the first specific embodiment, is provided in the bonding areas of cap wafer 3'. Prestructured cap wafer 3', which is somewhat more complicated in this specific embodiment, is thus easily bonded to uppermost strip conductor level LB0, resulting in the process state according to FIG. 2b).

In contrast to the first specific embodiment, cap wafer 3' requires a larger cavity 3b' in the area of the inertial sensor device, and an additional cavity 3b'' in the area of the pressure sensor device in order to avoid placing cap wafer 3' on the pressure sensor device, in particular in diaphragm area M, and inertial sensor device IE.

Figure 2B:
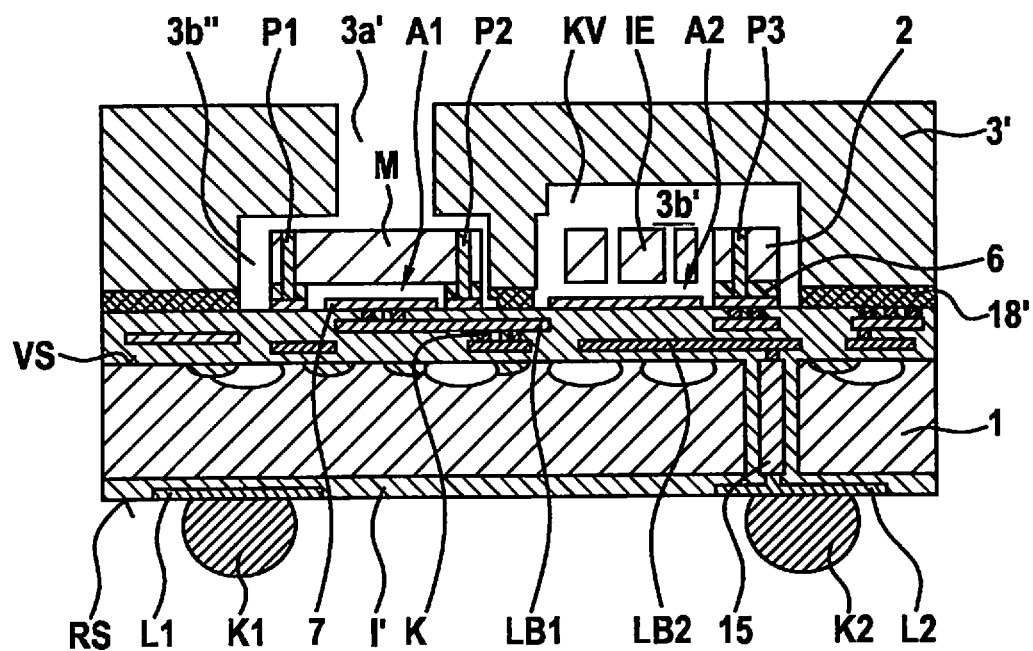

The further processing after the process state according to FIG. 2b) takes place similarly as in FIG. 1h).

Figure 3A:
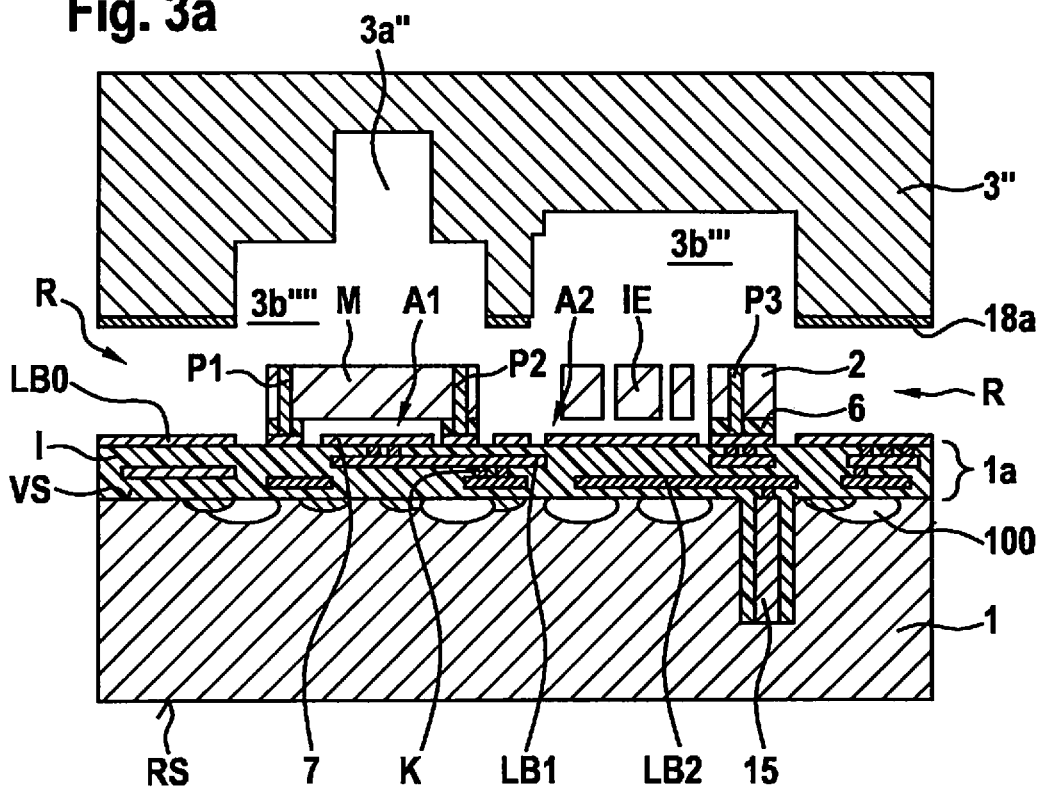
FIGS. 3a) and 3b) show schematic cross-sectional views for explaining a micromechanical pressure sensor device and a corresponding manufacturing method according to a third specific embodiment of the present invention.

FIGS. 3a) and 3b) show schematic cross-sectional views for explaining a micromechanical pressure sensor device and a corresponding manufacturing method according to a third specific embodiment of the present invention.

In the third specific embodiment, in contrast to the second specific embodiment, the cap wafer is denoted by reference numeral 3'' and has a recess 3b''' for the inertial sensor device, a recess 3b'''' for the pressure sensor device, and a previously created cavity 3a'' as a precursor for the pressure access.

Figure 3B:
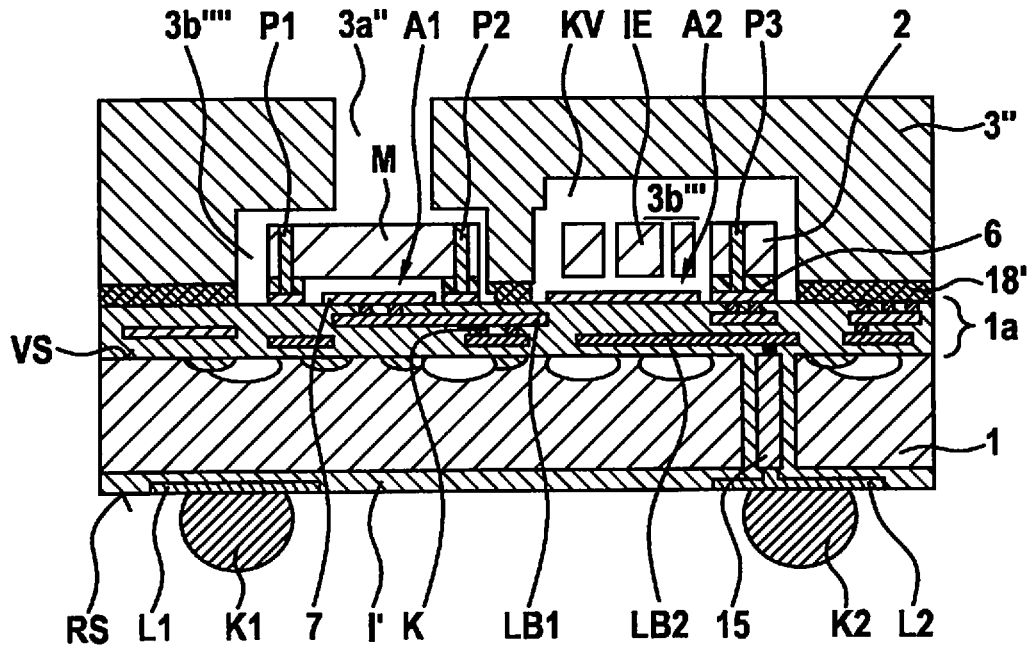

With reference to FIG. 3b), the bonding of cap wafer 3'' on previously exposed uppermost strip conductor level LB0 takes place with the aid of germanium bonding layer 18a, after which eutectic bond connection 18' is formed. After the bonding operation, cap wafer 3'' is ground down to expose pressure access 3a''.

Figure 4:
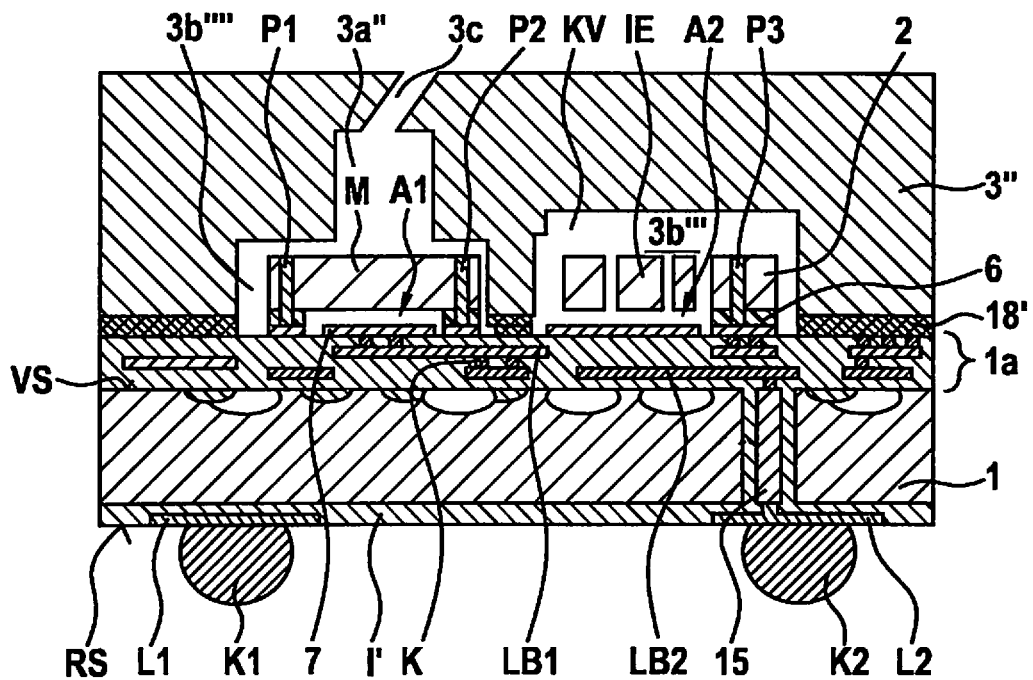
FIG. 4 shows a schematic cross-sectional view for explaining a micromechanical pressure sensor device and a corresponding manufacturing method according to a fourth specific embodiment of the present invention.

FIG. 4 shows a schematic cross-sectional view for explaining a micromechanical pressure sensor device and a corresponding manufacturing method according to a fourth specific embodiment of the present invention.

In the fourth specific embodiment according to FIG. 4, in contrast to the third specific embodiment, cap wafer 3'' is not ground down, but, rather, pressure access 3a'' is exposed by an etching process or vertical or oblique laser drilling, thus forming passage 3c which exposes pressure access 3a'' to the outside.

Figure 5:
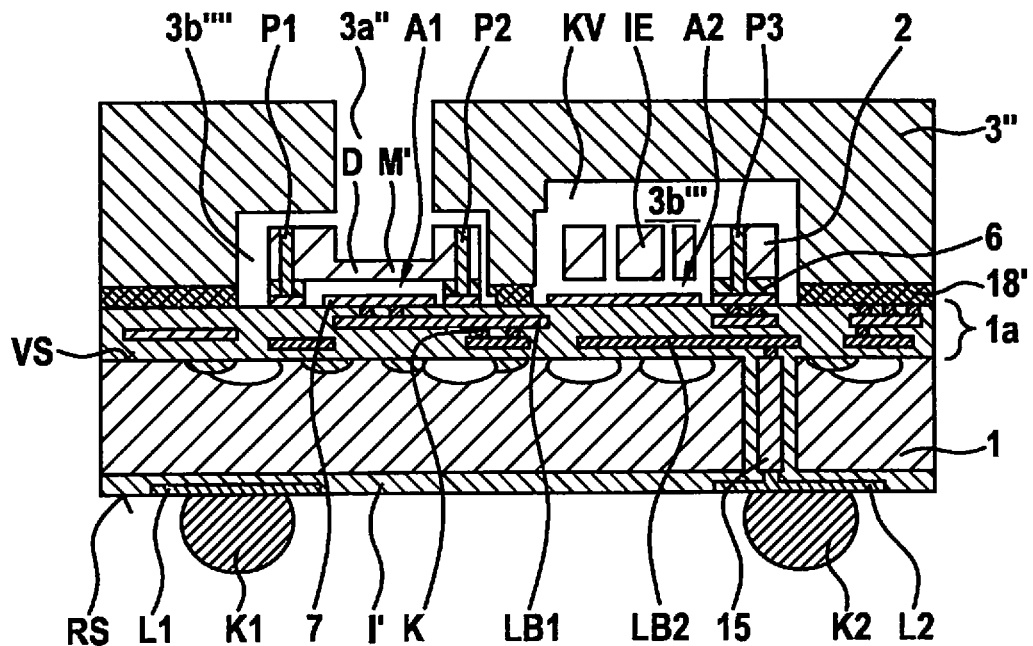
FIG. 5 shows a schematic cross-sectional view for explaining a micromechanical pressure sensor device and a corresponding manufacturing method according to a fifth specific embodiment of the present invention.

FIG. 5 shows a schematic cross-sectional view for explaining a micromechanical pressure sensor device and a corresponding manufacturing method according to a fifth specific embodiment of the present invention.

In the fifth specific embodiment, the diaphragm area denoted by reference sign M' has a thinned area D of micromechanical functional layer 2 which may be created by an appropriate photolithographic etching process, for example.

The basis for this operation is that the thickness of micromechanical functional layer 2 which is back-ground from wafer 2a is typically 30 μm, and the sensitivity of diaphragm area M' may be increased due to thinned area D.

Otherwise, the process state according to FIG. 5 corresponds to that according to FIG. 3b.

Figure 6:
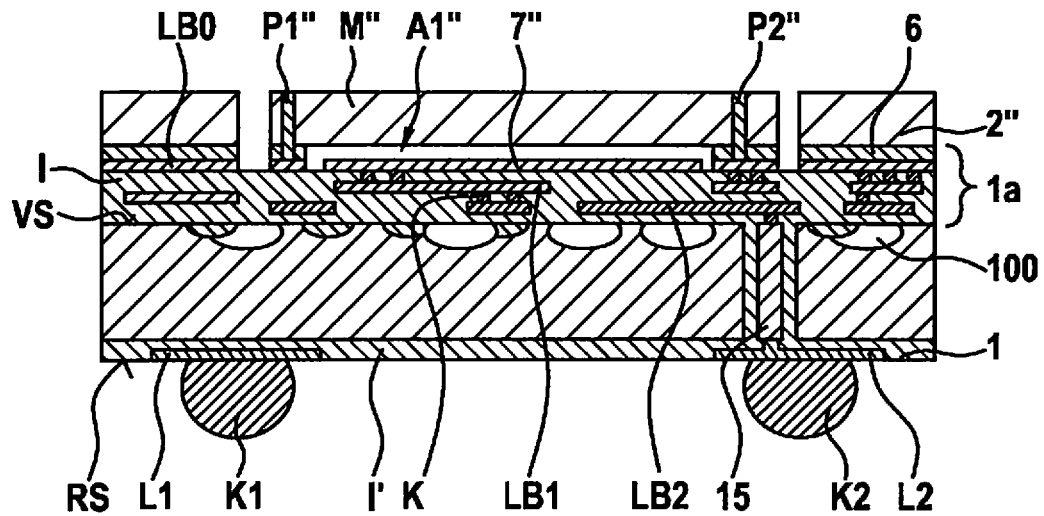
FIG. 6 shows a schematic cross-sectional view for explaining a micromechanical pressure sensor device and a corresponding manufacturing method according to a sixth specific embodiment of the present invention.

FIG. 6 shows a schematic cross-sectional view for explaining a micromechanical pressure sensor device and a corresponding manufacturing method according to a sixth specific embodiment of the present invention.

In the sixth specific embodiment, in comparison to the first specific embodiment, inertial sensor device IE is dispensed with and diaphragm area M'' together with recess A1'' therebelow in micromechanical functional layer 2'' have a correspondingly larger design. The contact plugs are denoted here by reference numerals P1" and P2", and the second pressure detection electrode is denoted by reference numeral 7".

Otherwise, the process state according to FIG. 6 is the same as the process state according to FIG. 1h).

In this specific embodiment, diaphragm area M" is naturally not as well protected from handling influences, so that special precautions must be taken during handling and transport of the components.

Figure 7:
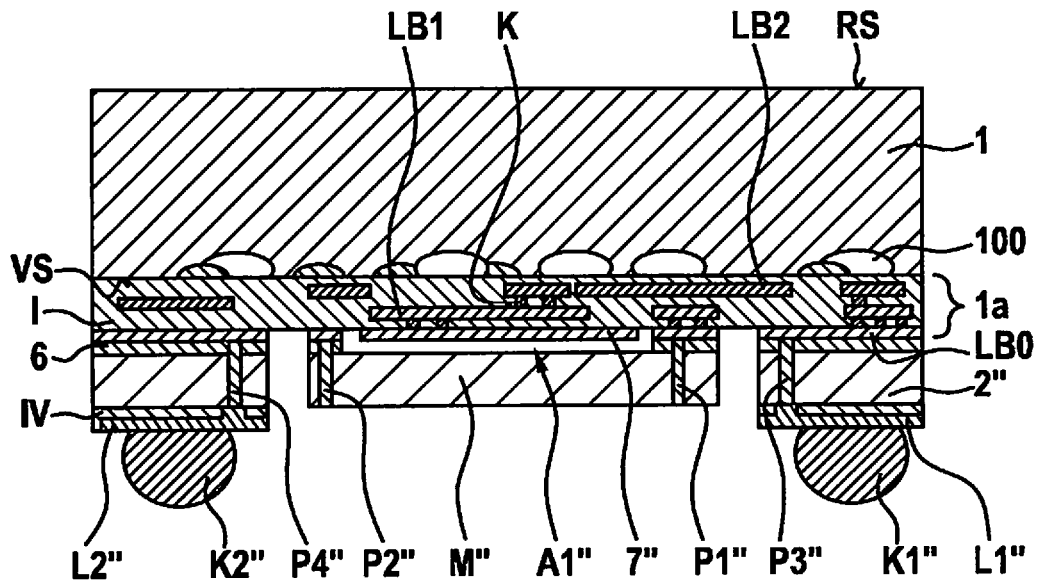
FIG. 7 shows a schematic cross-sectional view for explaining a micromechanical pressure sensor device and a corresponding manufacturing method according to a seventh specific embodiment of the present invention.

FIG. 7 shows a schematic cross-sectional view for explaining a micromechanical pressure sensor device and a corresponding manufacturing method according to a seventh specific embodiment of the present invention.

In the seventh specific embodiment, in comparison to the sixth specific embodiment, via 15 is dispensed with and the contacting or mounting takes place via front side VS, in that an insulating layer IV is mounted and structured above micromechanical functional layer 2", on which strip conductors L1" and L2" are once again provided, on which bonding balls K1" and K2" for soldering the component are mounted on a suitable substrate.

Bonding balls K1" and K2" are connected to uppermost strip conductor level LB0 via strip conductors L1" and L2" and via contact plugs P3" and P4", similarly as for contact plugs P1" and P2".

Figure 8:
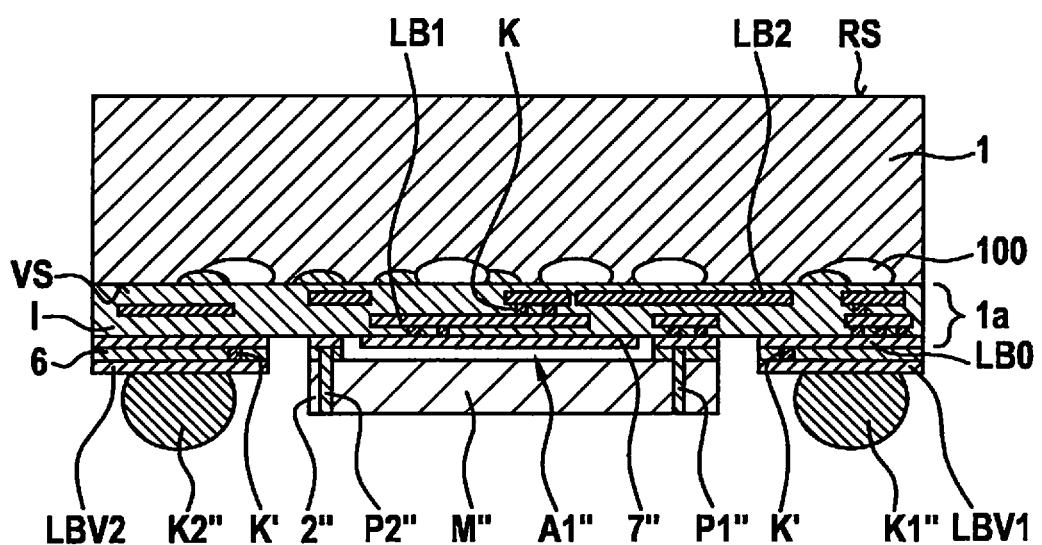
FIG. 8 shows a schematic cross-sectional view for explaining a micromechanical pressure sensor device and a corresponding manufacturing method according to an eighth specific embodiment of the present invention.

FIG. 8 shows a schematic cross-sectional view for explaining a micromechanical pressure sensor device and a corresponding manufacturing method according to an eighth specific embodiment of the present invention.

In the eighth specific embodiment, in comparison to the seventh specific embodiment, bonding balls K1" and K2" are provided on strip conductor sections LDV1 and LDV2, which are mounted directly on insulating layer 6 and which are connected to uppermost strip conductor level LB0 by vias K'.

Although the present invention has been described with reference to preferred exemplary embodiments, it is not limited thereto. In particular, the mentioned materials and topologies are solely examples, and are not limited to the described examples.

Although a combination of a micromechanical pressure sensor device with a micromechanical inertial sensor device in the micromechanical functional layer has been described in the first through fifth specific embodiments above, the present invention is not limited thereto.

Rather, further sensors or sensor devices or MEMS components, such as magnetic field sensor devices (for example, Lorenz force-based magnetic sensors), rotational acceleration sensors, oscillators, radio frequency MEMS, etc., may be combined with the micromechanical pressure sensor device in the micromechanical functional layer.

What is claimed is:

1. A micromechanical sensor device which includes:
an ASIC wafer having a front side and a rear side;
on the front side, a system including a plurality of strip conductor levels and insulating layers situated between the strip conductor levels;
a structured insulating layer formed above an uppermost strip conductor level of the plurality of strip conductor levels;
a micromechanical functional layer in which a first micromechanical functional region and a second micromechanical functional region are formed side-by side, wherein a portion of the micromechanical functional layer is formed on the structured insulating layer;
a cap covering the first and second micromechanical functional regions;

wherein:
the first micromechanical functional region includes, above a first recess in the structured insulating layer, a diaphragm that forms a first pressure detection electrode of a pressure sensor and that can be acted on by pressure via a pressure access through the cap, which exposes the diaphragm under the cap to an environment over the cap;
a second pressure detection electrode of the pressure sensor is formed of a portion of the uppermost strip conductor level that is in the recess at a distance from, and electrically insulated from, the diaphragm;
the diaphragm is electrically connected to the uppermost strip conductor level by at least one first contact plug that is led through the diaphragm and through the structured insulating layer;
the second micromechanical functional region forms at least a part of a second sensor and is isolated from and unexposed to the environment over the cap and an environment of the first micromechanical functional region; and
the second sensor is one of an inertial sensor, a magnetic field sensor, and a rotational acceleration sensor.

2. The micromechanical sensor device as recited in claim 1, wherein the at least one first contact plug is formed as a circumferential ring.

3. The micromechanical sensor device as recited in claim 1, wherein the cap is formed by a cap wafer bonded to the micromechanical functional layer.

4. The micromechanical pressure sensor device as recited in claim 1, wherein the cap is formed of a cap wafer, which includes the pressure access and is bonded to the uppermost strip conductor level.

5. The micromechanical sensor device as recited in claim 1, wherein the diaphragm includes a thinned area of the micromechanical functional layer.

6. A manufacturing method for a micromechanical sensor device, comprising:
providing an ASIC wafer having a front side and a rear side;
forming on the front side a system including a plurality of strip conductor levels and insulating layers situated between the strip conductor levels;
forming a structured insulating layer above an uppermost strip conductor level of the plurality of strip conductor levels;
bonding a wafer to the structured insulating layer;
thinning the bonded wafer to form a micromechanical functional layer;
structuring, out of the micromechanical functional layer, a first micromechanical functional region above a first recess in the structured insulating layer and a second micromechanical functional region above a second recess in the structured insulating layer, wherein the first and second micromechanical functional regions are side-by-side;
attaching a cap covering the first and second micromechanical functional regions, wherein the first micromechanical functional region includes, above the recess, a diaphragm that forms a first pressure detection electrode of a pressure sensor and that can be acted on by pressure via a pressure access through the cap, which exposes the diaphragm under the cap to an environment over the cap;
forming, out of a portion of the uppermost strip conductor level, a second pressure detection electrode of the pressure sensor, wherein the second pressure detection electrode which is electrically insulated from the diaphragm; and forming at least one first contact plug which is led through the diaphragm and through the structured insulating layer, as the result of which the diaphragm is electrically connected to the uppermost strip conductor level;

wherein:

the second micromechanical functional region forms at least a part of a second sensor and is isolated from and unexposed to the environment over the cap and an environment of the first micromechanical functional region; and the second sensor is one of an inertial sensor, a magnetic field sensor, and a rotational acceleration sensor.

7. The manufacturing method as recited in claim 6, wherein the structured insulating layer includes at least one of an oxide layer and at least one nitride layer, and the bonding takes place at a temperature below 400° C. by way of a plasma-activated direct bonding process.

8. The manufacturing method as recited in claim 6, wherein a first contact plug is provided which is formed as a circumferential ring.

9. The manufacturing method as recited in claim 6, wherein a cap wafer which has a pressure access to the diaphragm area is bonded to the micromechanical functional layer.

10. The manufacturing method as recited in claim 6, wherein the micromechanical functional layer and the insulating layer are removed from the uppermost strip conductor level in areas, and the attaching of the cap includes, subsequent to the removal, bonding to the uppermost strip conductor level a cap wafer which has a pressure access to the diaphragm area.

11. The manufacturing method as recited claim 6, wherein the micromechanical functional layer is thinned in the diaphragm area.

12. The micromechanical sensor device as recited in claim 1, wherein the cap includes a region that extends downward to between the first and second micromechanical functional regions for the isolation of the micromechanical functional regions from each other.

13. The micromechanical sensor device as recited in claim 5, wherein the diaphragm includes a thick area of the micromechanical functional layer surrounding the thin area, forming a concavity facing the cap.

* * * * *